United States Patent
Blagojevic et al.

(10) Patent No.: US 9,995,797 B2
(45) Date of Patent: Jun. 12, 2018

(54) ANGLE SENSOR AND METHOD OF MEASURING AN ANGLE OF A MAGNETIC FIELD

(71) Applicant: Senis AG, Zug (CH)

(72) Inventors: Marjan Blagojevic, Nis (RS); Sasa Dimitrijevic, Mramor (RS); Radivoje Popovic, Zug (CH); Dragana Popovic Renella, Zug (CH); Sasa Spasic, Baar (CH)

(73) Assignee: Senis AG, Zug (CH)

( * ) Notice: Subject to any disclaimer, the term of this patent is extended or adjusted under 35 U.S.C. 154(b) by 13 days.

(21) Appl. No.: 15/442,397

(22) Filed: Feb. 24, 2017

(65) Prior Publication Data

US 2017/0248661 A1 Aug. 31, 2017

(30) Foreign Application Priority Data

Feb. 25, 2016 (EP) .................................... 16157316

(51) Int. Cl.
*G01R 33/00* (2006.01)
*G01R 33/09* (2006.01)
*G01R 33/07* (2006.01)

(52) U.S. Cl.
CPC ....... *G01R 33/0005* (2013.01); *G01R 33/072* (2013.01); *G01R 33/091* (2013.01)

(58) Field of Classification Search
CPC G01R 33/0005; G01R 33/091; G01R 33/072; G01R 33/077; G01R 33/07; G01R 33/075; G01R 33/0029; G01R 33/0023; G01R 33/0035; G01R 33/04; G01R 33/096; G01R 33/10; G01R 15/18; G01R 15/202;

(Continued)

(56) References Cited

U.S. PATENT DOCUMENTS 4,966,041 A * 10/1990 Miyazaki ............... G01D 5/145
324/207.2
5,712,560 A * 1/1998 Maeda .................... G01P 3/487
324/166
5,880,586 A 3/1999 Dukart et al.
(Continued)

FOREIGN PATENT DOCUMENTS

EP 2 028 450 A2 2/2009
EP 2 846 136 A1 3/2015
(Continued)

*Primary Examiner* — Tung X Nguyen
*Assistant Examiner* — Lee Rodak
(74) *Attorney, Agent, or Firm* — CanaanLaw, P.C.; David B. Ritchie (57) ABSTRACT

The invention concerns an angle sensor and a method of measuring an angle of a magnetic field. The angle sensor is configured to measure a direction of a magnetic field in a plane, comprising a first magnetic field sensor having a first sensitivity direction and delivering a first voltage, a second magnetic field sensor having a second sensitivity direction and delivering a second voltage, a first current source supplying a first biasing current to the first magnetic field sensor, a second current source supplying a second biasing current to the second magnetic field sensor (2), and electronic circuitry configured to adjust the first biasing current and the second biasing current in such a manner that a sum of the first voltage and the second voltage equals 0.

6 Claims, 5 Drawing Sheets

(58) Field of Classification Search
CPC ...... G01R 15/20; G01R 21/08; G01R 31/025; G01D 5/145
See application file for complete search history.

(56) References Cited

U.S. PATENT DOCUMENTS

| | | | |
|---|---|---|---|
| 5,942,895 A | 8/1999 | Popovic et al. | |
| 6,545,462 B2 | 4/2003 | Schott et al. | |
| 7,235,968 B2 | 6/2007 | Popovic et al. | |
| 7,818,138 B2* | 10/2010 | Yoshida | G03B 13/36 324/207.17 |
| 7,825,657 B2* | 11/2010 | Rossmann | G01R 33/07 324/251 |
| 8,324,891 B2 | 12/2012 | Kejik et al. | |
| 8,508,218 B2 | 8/2013 | Reymond et al. | |
| 8,624,587 B2 | 1/2014 | Popovic et al. | |
| 8,749,005 B1 | 6/2014 | Foletto et al. | |
| 8,922,206 B2 | 12/2014 | Friedrich et al. | |
| 8,963,540 B2 | 2/2015 | Reymond et al. | |
| 2008/0074106 A1* | 3/2008 | Oohira | G01R 33/07 324/209 |
| 2009/0121707 A1 | 5/2009 | Schott | |
| 2010/0164491 A1 | 7/2010 | Kejik et al. | |

FOREIGN PATENT DOCUMENTS

| | | |
|---|---|---|
| JP | 2007-57501 A | 3/2007 |
| WO | 96/16316 A1 | 5/1996 |
| WO | 2015/003283 A1 | 1/2015 |

\* cited by examiner

ANGLE SENSOR AND METHOD OF MEASURING AN ANGLE OF A MAGNETIC FIELD

PRIORITY CLAIM

Applicant hereby claims foreign priority under 35 U.S.C § 119 from European Patent Application No. 16157316.7 filed on Feb. 25, 2016, the disclosure of which is herein incorporated by reference.

FIELD OF THE INVENTION

The invention relates to an angle sensor configured to measure the direction of a magnetic field in a plane and to a method of measuring an angle which describes a direction of a magnetic field in a plane.

BACKGROUND OF THE INVENTION

Angle sensors configured to measure the direction of the magnetic field are known for example from U.S. Pat. No. 6,545,462, U.S. Pat. No. 8,324,891 and U.S. Pat. No. 8,624,587. A magnetic field sensor comprising a horizontal Hall element capable of measuring a magnetic field pointing in a direction parallel to a surface of the Hall element is known for example from U.S. Pat. No. 5,942,895.

SUMMARY OF THE INVENTION

The object of the invention is to develop a fast and reliable angle sensor.

The basic concept of the sensors according to the invention consists in providing a magnetic field sensor having a variable sensitivity direction and to rotate the sensitivity direction until the scalar product of the sensitivity vector S of the magnetic field sensor and the magnetic field B is zero, i.e. S*B=0.

An angle sensor configured to measure an angle α which describes a direction of a magnetic field in a plane, comprises
  a first magnetic field sensor having a first sensitivity direction,
  a second magnetic field sensor having a second sensitivity direction,
  each of the first and second magnetic field sensor having two current terminals and two voltage terminals,
  a first current source supplying a first biasing current $I_1$ to the current terminals of the first magnetic field sensor,
  a second current source supplying a second biasing current $I_2$ to the current terminals of the second magnetic field sensor, and
  electronic circuitry forming a closed control loop configured to rotate a sensitivity direction of the angle sensor by changing the biasing currents $I_1$ and $I_2$ until a signal U equals 0 and to determine the angle α from the sensitivity direction of the angle sensor when the signal U equals 0,
  wherein either the voltage terminals of the first and second magnetic field sensor are connected in series and the voltage appearing over the series connected voltage terminals is tapped and amplified to deliver the signal U, or the voltage terminals of the first and second magnetic field sensor are connected in parallel and the voltage appearing at the parallel connected voltage terminals is tapped and amplified to deliver the signal U, or wherein the angle sensor comprises a first amplifier coupled to the voltage terminals of the first magnetic field sensor, a second amplifier coupled to the voltage terminals of the second magnetic field sensor, and a summing junction coupled to the outputs of the first and second amplifier and having an output delivering the signal U.

The first sensitivity direction and the second sensitivity direction include an angle δ. Preferably, the angle δ is 90°. The electronic circuitry is preferably configured to rotate the sensitivity direction of the angle sensor by providing the first biasing current $I_1$ as $I_1 = I*\sin δ * \cos θ$ and the second biasing current as $I_2 = I*(\sin δ - \cos δ)*\sin δ*\sin θ$, the quantity I denoting a nominal current intensity and the quantity θ denoting an angle, and changing the angle θ, and the electronic circuitry is further configured to determine the angle α to α=θ−90° or α=θ+90°.

According to the invention, a method of measuring an angle α which describes a direction of a magnetic field in a plane comprises
  providing a first magnetic field sensor having a first sensitivity direction and delivering a first voltage $U_1$,
  providing a second magnetic field sensor having a second sensitivity direction and delivering a second voltage $U_2$,
  supplying a first biasing current $I_1$ to the first magnetic field sensor,
  supplying a second biasing current $I_2$ to the second magnetic field sensor,
  forming a signal U that is proportional to a sum of the first voltage $U_1$ and the second voltage $U_2$,
  adjusting the biasing currents $I_1$ and $I_2$ until the signal U equals 0, and
  determining the angle α based on the adjusted values of the biasing currents $I_1$ and $I_2$ when the signal U equals 0.

Preferably, the adjusting the biasing currents $I_1$ and $I_2$ until the signal U equals 0 occurs by providing the first biasing current $I_1$ as $I_1 = I*\sin δ * \cos θ$ and the second biasing current as $I_2 = I*(\sin δ - \cos δ)*\sin δ*\sin θ$, the quantity I denoting a nominal current intensity, the quantity θ denoting an angle and the quantity δ denoting an angle which the first sensitivity direction and the second sensitivity direction include, and changing the angle θ until the signal U equals 0. The method then further comprises determining the angle α to α=θ−90° or α=θ+90°.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

In the following, the same reference numerals are used to designate the same elements in the different embodiments. State-of-the-art CMOS technology may be used to make the sensors.

Figure 1:
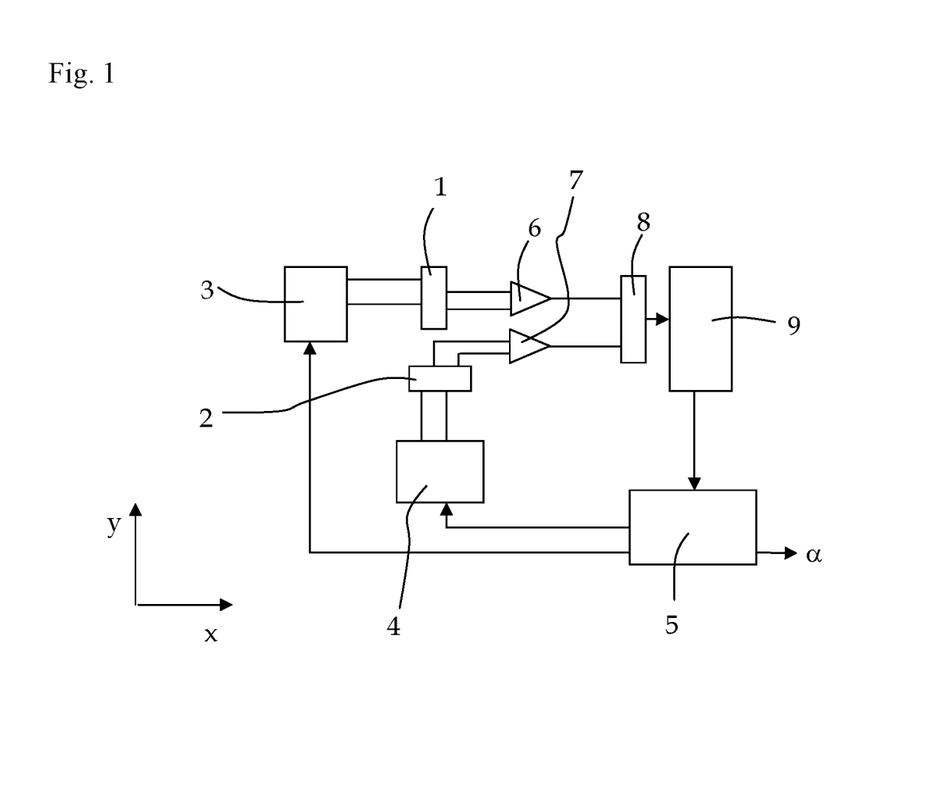
FIG. 1 shows a schematic diagram of an angle sensor according to the invention.

FIG. 1 shows a schematic diagram of an angle sensor according to the invention. A Cartesian coordinate system with axes x and y oriented perpendicularly to each other is used to explain the invention. The sensor comprises a first magnetic field sensor 1, a second magnetic field sensor 2 and electronic circuitry configured to operate the magnetic field sensors 1 and 2 and provide an output signal. Each of the magnetic field sensors 1, 2 has a predetermined sensitivity direction $S_A$ or $S_B$, respectively. The sensitivity direction $S_A$ of the first magnetic field sensor 1 may be parallel to the x-axis, the sensitivity direction $S_B$ of the second magnetic field sensor 2 may be parallel to the y-axis. Preferably, the sensitivity directions $S_A$ and $S_B$ of the two magnetic field sensors 1, 2 are oriented perpendicularly to each other. However, the magnetic field sensors 1 and 2 may have any other orientation and their sensitivity directions $S_A$ and $S_B$ may include an arbitrary angle $\delta$. The two magnetic field sensors 1, 2 ideally have the same nominal sensitivity, denoted by $S_0$.

The first magnetic field sensor 1 and the second magnetic field sensor 2 may each be a vertical Hall element or a cluster composed of parallel aligned vertical Hall elements. Alternatively, the first magnetic field sensor 1 and the second magnetic field sensor 2 may each be composed of one or more horizontal Hall elements and one or more magnetic field concentrators in such a way that the first magnetic field sensor 1 is sensitive to a magnetic field pointing in the x-direction and the second magnetic field sensor 2 is sensitive to a magnetic field pointing in the y-direction, as disclosed for example in U.S. Pat. No. 5,942,895. Each Hall element comprises four electrical terminals, namely two current terminals serving to supply a biasing current and two voltage terminals serving to tap a Hall voltage. The magnetic field sensors 1, 2 may also be any other type of magnetic field sensor that is biased by a current and delivers a voltage, such as for example magnetoresistive (MR) sensors composed of four magnetoresistive resistors coupled to form a Wheatstone bridge. Therefore, each of the magnetic field sensors 1 and 2 comprises four electrical terminals, namely two current terminals configured to supply a biasing current and two voltage terminals configured to tap a voltage.

The sensor further comprises a first current source 3 providing a first biasing current $I_1$ and a second current source 4 providing a second biasing current $I_2$. The first current source 3 is coupled to the current terminals of the first magnetic field sensor 1, the second current source 4 is coupled to the current terminals of the second magnetic field sensor 2.

The sensor further comprises a first circuit 5 configured to control the first current source 3 and the second current source 4 such that the first biasing current $I_1$ and the second biasing current $I_2$ are related to each other by the following equations:

$$I_1 = I^* \sin \delta^* \cos \theta \quad (1)$$

$$I_2 = I^*(\sin \delta - \cos \delta)^* \sin \delta^* \sin \theta \quad (2)$$

wherein the parameter I denotes a constant nominal current intensity and the parameter $\theta$ denotes an angle.

If the angle $\delta$ is 90°, i.e. if the sensitivity directions $S_A$ and $S_B$ run orthogonally to each other, equations (1) and (2) reduce to $$I_1 = I^* \cos \theta \quad (3)$$

$$I_2 = I^* \sin \theta \quad (4)$$

In this case, the voltages $U_1$ and $U_2$ are given by the equations:

$$U_1 = S_0^* I_1^* B_X \quad (5)$$

$$U_2 = S_0^* I_2^* B_Y \quad (6)$$

wherein $S_0$ denotes the magnitude of the sensitivity of the magnetic field sensors 1 and 2 and $B_X$ and $B_Y$ denote the components of the magnetic field along the x-axis or the y-axis.

In the following embodiments, it is assumed, that the angle $\delta$ is 90°.

In an embodiment, the sensor further comprises a first amplifier 6 configured to amplify the voltage $U_1$ of the first magnetic field sensor 1 and a second amplifier 7 configured to amplify the voltage $U_2$ of the second magnetic field sensor 2. The amplifiers 6 and 7 ideally have the same gain k. The output voltages of the first amplifier 6 and the second amplifier 7 are fed to the inputs of a summing junction 8 and summed there. The output of the summing junction 8 delivers a voltage $$U = k^*(U_1 + U_2) = k^* S_0^* I^*(B_X^* \cos + B_Y^* \sin \theta) \quad (7)$$

In the ideal case, the sensitivity of the magnetic field sensor, the nominal current intensity supplied to the magnetic field sensor and the gain of the amplifier are all the same for both magnetic field sensors. Therefore, ideally the magnetic field sensors have as described above a same sensitivity $S_0$, are supplied with a same nominal current intensity I and the amplifiers have a same gain k. If there are deviations from the ideal case, then this might be corrected for in a calibration step, for example by adjusting different gains for the two amplifiers 6 and 7 or by adjusting different nominal current intensities, so that the equations given above apply.

In another embodiment, the voltage terminals of the first magnetic field sensor 1 and the second magnetic field sensor 2 are connected in series or in parallel. The voltage $U_1 + U_2$ appearing over the series connected voltage terminals may be tapped and amplified to deliver the voltage $U = k^*(U_1 + U_2)$ or the voltage appearing at the parallel connected voltage terminals is tapped and amplified to deliver the voltage $U = k^*(U_1 + U_2)$, wherein the quantity k again denotes the gain.

The sensor, composed of the first circuit 5, the two current sources 3, 4, the two magnetic field sensors 1, 2, the amplifiers 6, 7 and the summing junction 8, as well as the sensor with the structure and elements described in the preceding paragraph, is a sensor having two current inputs each receiving one of the biasing currents $I_1$ or $I_2$, and a voltage output delivering the voltage $U = k^*(U_1 + U_2)$. The sensor can be used as magnetic field sensor having an adjustable direction of sensitivity S. The direction of sensitivity S in the xy-plane is given by the angle $\theta$. Preferably, the sensitivity directions $S_A$ and $S_B$ run orthogonally to each other and the biasing currents $I_1$ and $I_2$ are set according to equations (3) and (4). The voltage U is proportional to the component of the magnetic field pointing in the direction of sensitivity S. The first circuit 5 has a first input configured to receive the angle θ.

The angle sensor further comprises a second circuit 9 having an input configured to receive the voltage U and an output coupled to the first input of the first circuit 5. In the following, the real angle of the magnetic field in the xy-plane is denoted as angle $\alpha_B$, the angle determined by the angle sensor is denoted as angle α.

The first circuit 5 and the second circuit 9 form a closed control loop that is configured to change the biasing currents $I_1$ and $I_2$ until the voltage U equals zero. In this embodiment, this is done by supplying the magnetic field sensors 1 and 2 with biasing currents $I_1$ or $I_2$, respectively, according to equations (1) and (2) and to vary the angle θ automatically by the closed loop formed by the circuits 5 and 9 until U=0, which in practice means until $|U| \leq U_T$ where $U_T$ denotes a minimal detectable voltage. As $U=k*(U_1+U_2)$ this means that the sum of the voltages of the first magnetic field sensor 1 and the second magnetic field sensor 2 is regulated to zero, i.e. to $$U_1+U_2=0 \quad (8)$$

The condition U=0 is fulfilled when the scalar product of the sensitivity vector S and the magnetic field vector B is zero, i.e. when S*B=0. This equation has two solutions which means that the angles θ and α are related to each other by one of the equations $$\alpha=\theta-90° \quad (9)$$

$$\alpha=\theta+90° \quad (10)$$

Figure 2:
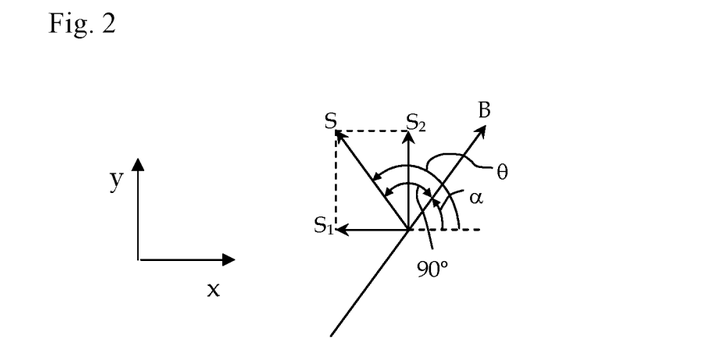
FIG. 2 shows a diagram illustrating the relationship between the sensitivity vector S of the angle sensor and the magnetic field B.

FIG. 2 illustrates the relation between the sensitivity vector S of the captioned magnetic field sensor and the magnetic field vector B and therefore the relation between the angles θ and α. $S_1$ is a vector denoting the magnitude and direction of the sensitivity of the first magnetic field sensor 1 and $S_2$ is a vector denoting the magnitude and direction of the sensitivity of the second magnetic field sensor 2.

The circuits 5 and 9 may be formed of digital and/or analog circuits.

The concept of the angle sensor according to the invention consists in providing a magnetic field sensor with variable sensitivity direction and to rotate the sensitivity direction until the scalar product of the sensitivity vector S of the magnetic field sensor and the magnetic field B is zero, i.e. S*B=0, and of the finding that $U_1+U_2=0$ if S*B=0. So:
  a) The angle sensor comprises two magnetic field sensors 1 and 2 each having two current terminals and two voltage terminals.
  b) The voltage terminals of the first magnetic field sensor 1 and the second magnetic field sensor 2 are coupled to deliver a voltage $U=k*(U_1+U_2)$, where k is a predetermined amplification factor.
  c) The sensitivity direction is rotated by changing the biasing currents $I_1$ and $I_2$ until the voltage $U=k*(U_1+U_2)$ is 0.
  d) The measured direction of the magnetic field in the plane spanned by the axes x and y is given by the angle α=θ-90° or the angle α=θ+90° because the sensitivity vector S runs perpendicularly to the magnetic field vector B if S*B=0.

Figure 3:
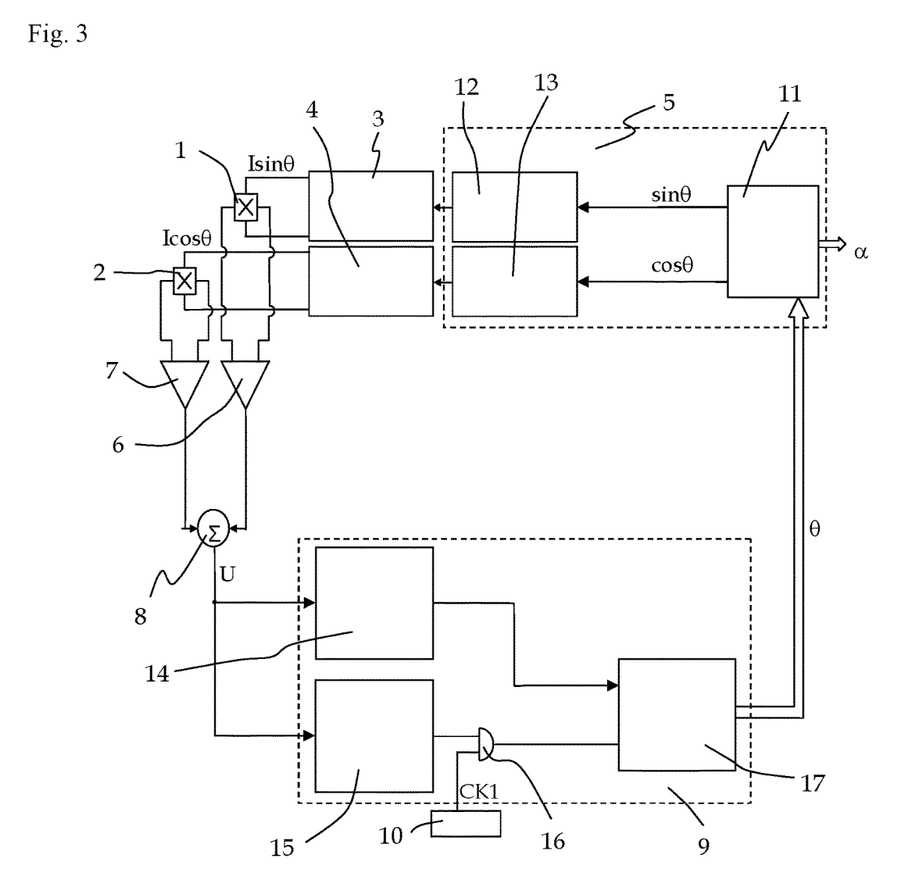
FIG. 3 shows an embodiment of an angle sensor according to the invention.

FIG. 3 shows an embodiment of an angle sensor according to the invention. The angle sensor comprises a clock signal generator 10 which controls the operation of the angle sensor. The first circuit 5 comprises a lookup table 11 and two D/A (Digital to Analog) converters 12 and 13. The two current sources 3 and 4 are voltage controlled current sources. At each clock pulse CK1 of the clock signal generator 10, the first circuit 5 gets the value θ at its first input, reads the digital values sin θ and cos θ in the lookup table 11, and feeds the digital value sin θ to the D/A converter 12 and the digital value cos θ to the D/A converter 13 and updates the value of the angle α. The analog output of the D/A converter 12 is fed to the first current source 3, the analog output of the D/A converter 13 is fed to the second current source 4. Therefore, the current supplied by the first current source 3 is proportional to I*sin θ and the current supplied by the second current source 4 is proportional to I*cos θ. The current sources 3 and 4 are adjusted to deliver the same nominal current I.

The second circuit 9 comprises a polarity detector 14, a signal detector 15, an AND gate 16 and an UP/DOWN counter 17. The output of the summing junction 8 is fed to an input of the polarity detector 14 and to an input of the signal detector 15. The polarity detector 14 delivers a binary output signal which is 1 if the voltage U at its input is positive or zero and which is 0 if the voltage U at its input is negative. The output of the signal detector 15 and the clock signal CK1 of the clock generator 10 are fed to two inputs of the AND gate 16. The signal detector 15 delivers a binary output signal, based on the magnitude of the input voltage U. If the magnitude of the input voltage U is higher than a minimal detectable signal, i.e. greater than a predetermined threshold value $U_T$, the output signal of the signal detector is 1. Otherwise, the output signal of the signal detector is 0.

The output signal of the AND gate 16 is a binary signal, based on the AND logic of its inputs. Only if both input signals are 1, the output will be 1. Therefore, the AND gate will let pass the clock pulses CK1 if the output of the signal detector is 1 and will block the clock pulses if the output of the signal detector is 0.

At each clock CK1 of the clock signal generator 10, the UP/DOWN counter 17 increments its value by 1 unit if the output signal of the polarity detector 14 is 1 and decrements its value by one unit if the output signal of the polarity detector 14 is 0. The value of the UP/DOWN counter 17 is fed to the first circuit 5. The value of the UP/DOWN counter 17 remains constant, if the voltage U is zero, i.e. if U=0. If the voltage U is not zero, then the value of the UP/DOWN counter 17 is changing at each clock CK1 until the voltage U has converged to zero. The value of the UP/DOWN counter 17 represents the angle θ of the sensitivity vector S.

The UP/DOWN counter 17 provides at its output a limited number N of values, the lowest value corresponds to the angle θ=0°, the highest value corresponds to the angle θ=360°−360°/N. The number N may for example be 360 if the angle sensor provides an angle resolution of 1°, or N=3600 if the angle sensor provides an angle resolution of 0.1°.

In this embodiment, the value of the UP/DOWN counter 17 is increased when the voltage U is positive and decreased when the voltage U is negative. As the voltage U is proportional to the scalar product S*B=|S|*|B|*cos (θ−α) this means that the sensitivity vector S is rotated in the counterclockwise direction if −90°<θ−α<90° and in the clockwise direction if 90°<θ−α<270° and has the consequence that the relationship between the angles θ and α is given by equation (9). The circuit 5 is therefore configured to read at each clock CK1 the angle θ at its first input and determine the angle α using equation (9).

At the start of the operation of the angle sensor (at switch on), a predetermined angle $\theta_0$ is used as starting value for θ.

$\theta_0$ may be 0 or assume any other value. After a certain number of clocks CK1, the value of the angle $\theta$ has converged to that value that makes U=0. Whenever the condition U=0 is fulfilled, the outputted angle $\alpha$ correctly represents the angle $\alpha_B$ of the magnetic field B, whenever this condition is not fulfilled, the outputted angle $\alpha$ does not represent the angle $\alpha_B$.

Figure 4:
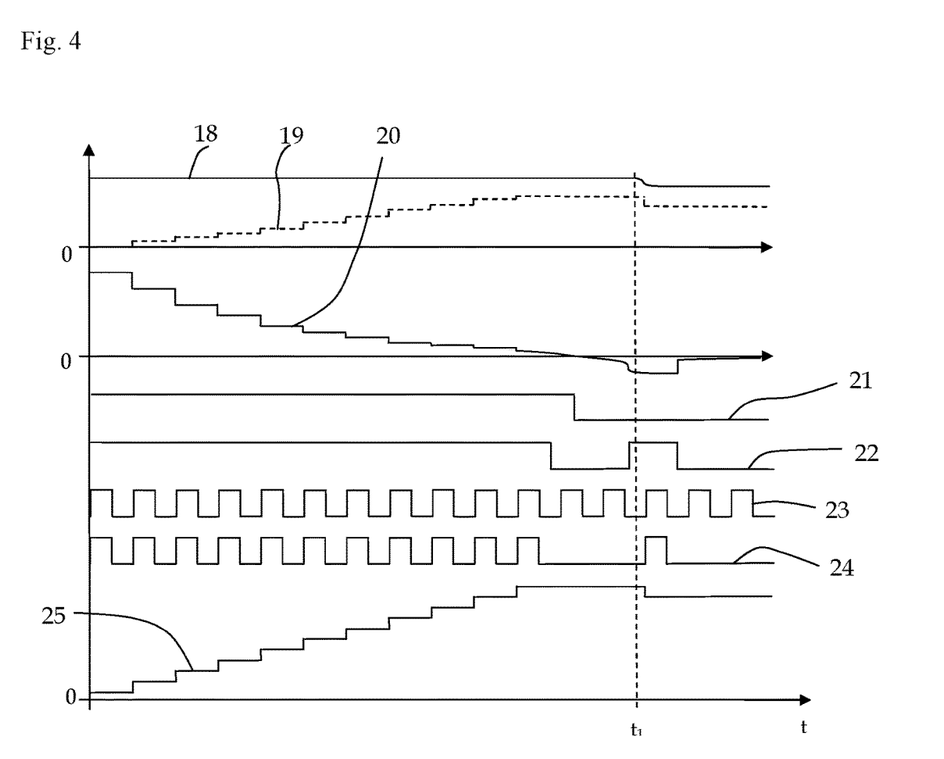
FIG. 4 shows several signal diagrams.

FIG. 4 shows an exemplary course of several signals in the course of the time t. The reference numerals denote:
  signal line 18: the angle $\alpha_B$ representing the real direction of the magnetic field vector B,
  signal line 19: the angle $\alpha$ outputted by the angle sensor,
  signal line 20: the voltage U at the output of the summing junction 8,
  signal line 21: the binary output signal of the polarity detector 14,
  signal line 22: the binary output signal of the signal detector 15
  signal line 23: the basic clock signal CK1,
  signal line 24: the binary output of the AND gate 16, and
  signal line 25: the output of the UP/DOWN counter 17.

In FIG. 4, the direction of the magnetic field vector B is at first constant in time over a certain period and then changes to another constant value. After turning on the angle sensor, due to the regulation provided by the feedback circuit formed by the first circuit 5 and the second circuit 9, the following occurs:
  The voltage U has a big value because the starting value $\theta_0$ is far from fulfilling the condition $\theta_0 = \alpha + 90°$. As time goes on, the voltage U converges step-by-step to zero.
  The output signal of the polarity detector 14 is 1 and changes to 0 when the voltage U has converged to 0.
  The output signal of the signal detector is 1 and changes to 0 when the voltage U has converged to 0.
  The clocks of the clock generator 10 pass the AND gate 16 as long as the output signal of the signal detector is 1. The clocks of the clock generator 10 do not pass the AND gate 16 when the output signal of the signal detector is 0.
  The UP/DOWN counter 17 increments its value by 1 unit with each pulse appearing at the output of the AND gate 16 as long as the output of the polarity detector 14 is 1, and decrements its value by 1 unit with each pulse appearing at the output of the AND gate 16 as long as the output of the polarity detector 14 is 0.

At the moment $t_1$, when the angle $\alpha_B$ decreases, the output voltage U becomes negative. When it becomes negative the binary output signal of the signal detector 15 changes from 0 to 1. Since the AND gate 16 lets then pass the clock pulses CK1, the UP/DOWN counter 17 decrements its value by 1 unit with each pulse, as long as the binary output signal of the signal detector 15 is 1.

Figure 5:
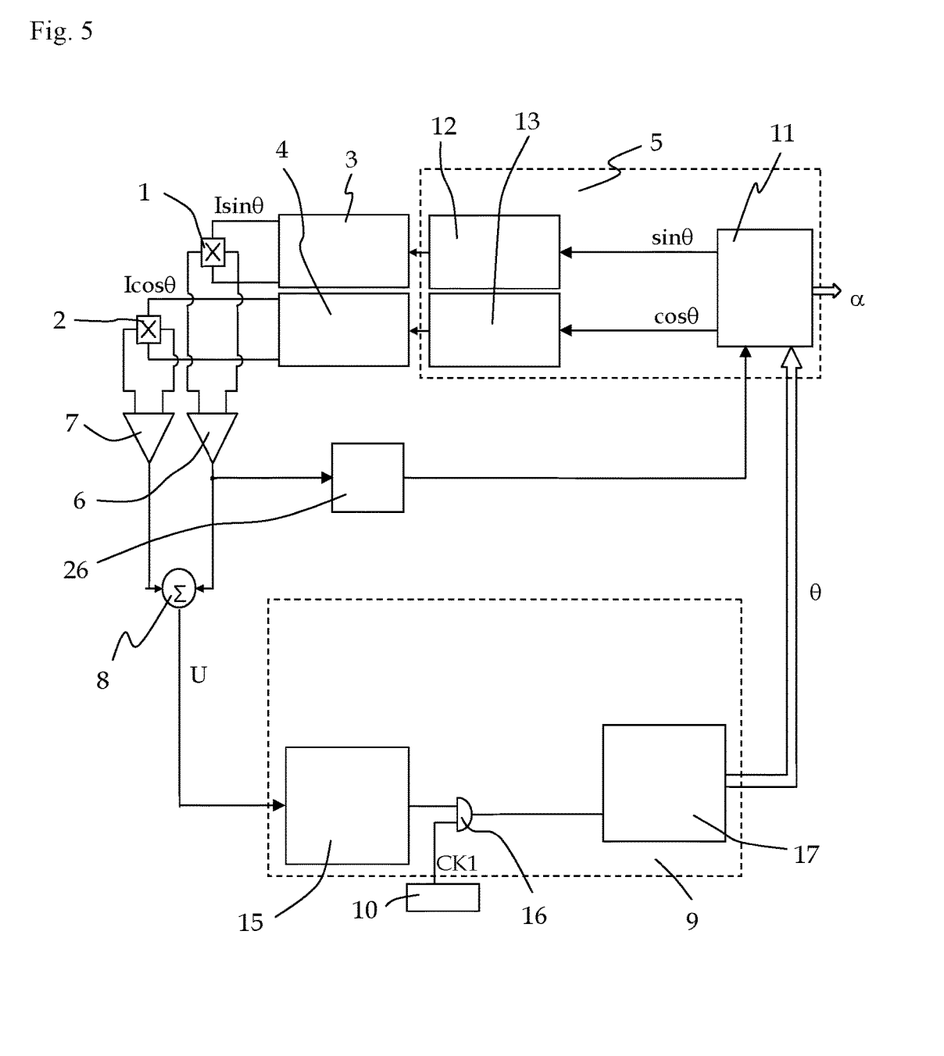
FIG. 5 shows a further embodiment of an angle sensor according to the invention.

In a further embodiment, shown in FIG. 5, the angle sensor does not comprise the polarity detector 14 but comprises a polarity detector 26 that is coupled to the output of the first amplifier 6. The polarity detector 26 delivers a binary output signal which is 1 if the voltage $U_1$ at its input is positive or zero and which is 0 if the voltage $U_1$ at its input is negative. The output signal of the polarity detector 26 therefore represents the sign of the voltage $U_1$ and is fed to a second input of the first circuit 5.

The angle $\theta$ defines the sensitivity direction. Therefore, the signs of the biasing currents $I_1$ and $I_2$ determine in which of the four quadrants the sensitivity vector S lies. The sign of the voltage $U_1$ determines whether the magnetic field vector B lies in one of the preceding quadrants (quadrants 2 and 3) or in one of the succeeding quadrants (quadrants 1 and 4). This information is then used to determine whether the relation between the angles $\theta$ and $\alpha$ is given by equation (9) or by equation (10), for example by use of the following lookup table containing the information, how the angle $\alpha$ is to be calculated:

| sign of $I_1$ | sign of $I_2$ | sign of $U_1$ | $\alpha = \theta$ + value below |
|---|---|---|---|
| − | + | − | −90° |
| + | − | + | +90° |
| − | + | + | +90° |
| + | − | − | −90° |
| − | − | + | −90° |
| + | + | + | +90° |
| − | − | − | +90° |
| + | + | − | −90° |

In this embodiment, the value of the UP/DOWN counter 17 is always increased when the voltage U is different from zero. This means, that the sensitivity vector S is always rotated in the counterclockwise direction when U≠0.

Figure 6:
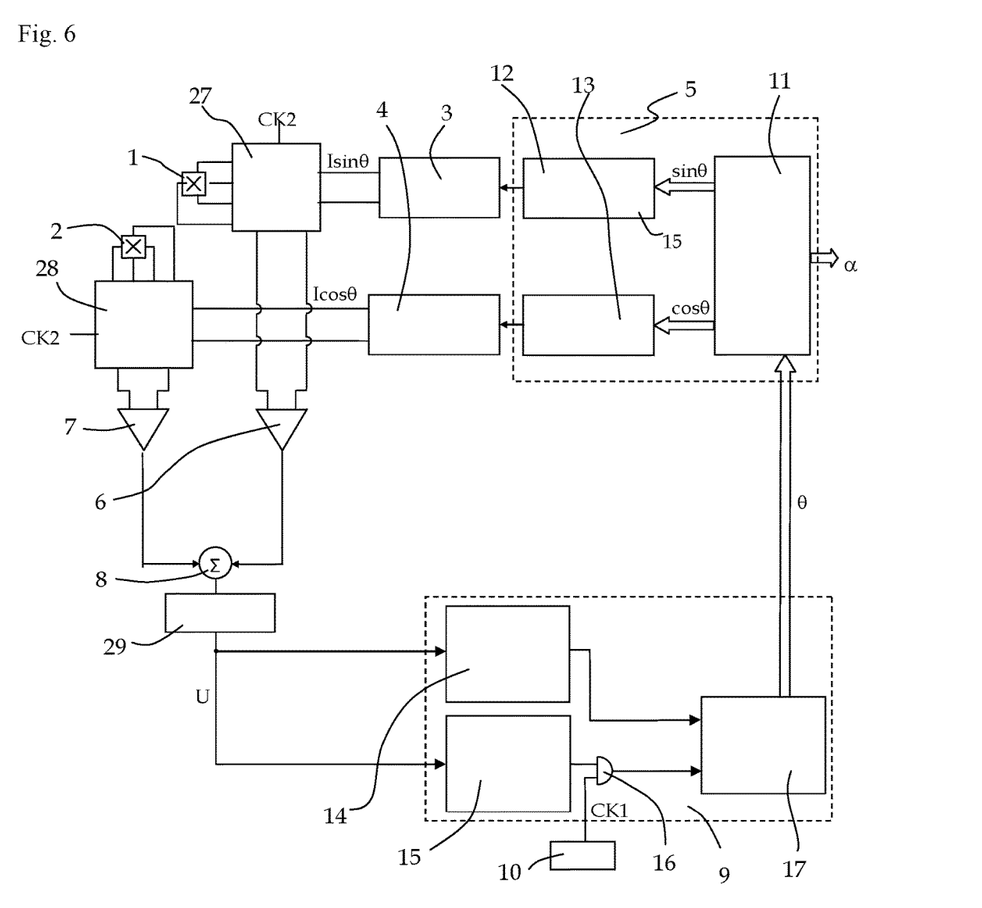
FIG. 6 shows an embodiment of an angle sensor according to the invention having Hall elements.

FIG. 6 shows an embodiment of an angle sensor according to the invention, wherein the magnetic field sensors 1 and 2 are Hall sensors which comprise Hall elements. In order to reduce or eliminate offset and 1/f noise problems of the Hall sensors, the well-known spinning current technique is used to operate the Hall sensors. The spinning current technique commutates the current and voltage terminals of each Hall sensor at a certain spinning clock CK2. Preferably, the four-phase spinning current technique is used, but also the two-phase spinning current technique could be used. The angle sensor comprises a first spinning current circuit 27 coupling the current terminals of the first magnetic field sensor 1 to the first current source 3 and the voltage terminals to the first amplifier 6 and a second spinning current circuit 28 coupling the current terminals of the second magnetic field sensor 2 to the second current source 4 and the voltage terminals to the second amplifier 7. The clock signal generator 10 generates also the spinning clock CK2 which is four times faster than the basic clock signal CK1 if the four-phase spinning current technique is used or two times faster than the basic clock signal CK1 if the two-phase spinning current technique is used. An integrator 29, for example formed as a switched capacitor filter, is connected to the output of the summing junction 8 to make an integration of the Hall voltage U over the four or two spinning current phases.

It would be apparent to those skilled in the art, that other analog and/or digital circuits, including microcontrollers and the like, may be used to realize the sensor of the invention.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except by the appended claims and their equivalents.

What is claimed is:
1. An angle sensor configured to measure an angle $\alpha$ which describes a direction of a magnetic field in a plane, comprising
  a first magnetic field sensor having a first sensitivity direction, the first magnetic field sensor having two current terminals and two voltage terminals, a second magnetic field sensor having a second sensitivity direction, the second magnetic field sensor having two current terminals and two voltage terminals, a first current source supplying a first biasing current $I_1$ to the current terminals of the first magnetic field sensor, a second current source supplying a second biasing current $I_2$ to the current terminals of the second magnetic field sensor, and electronic circuitry forming a closed control loop configured to rotate a sensitivity direction of the angle sensor by changing the biasing currents $I_1$ and $I_2$ until a signal U equals 0 and to determine the angle α from the sensitivity direction of the angle sensor when the signal U equals 0, wherein either the voltage terminals of the first and second magnetic field sensor are connected in series and the voltage appearing over the series connected voltage terminals is tapped and amplified to deliver the signal U, or the voltage terminals of the first and second magnetic field sensor are connected in parallel and the voltage appearing at the parallel connected voltage terminals is tapped and amplified to deliver the signal U, or wherein the angle sensor comprises a first amplifier coupled to the voltage terminals of the first magnetic field sensor, a second amplifier coupled to the voltage terminals of the second magnetic field sensor and a summing junction coupled to the outputs of the first and second amplifier and having an output delivering the signal U.

2. The angle sensor according to claim 1, wherein:

the first sensitivity direction and the second sensitivity direction include an angle δ, the electronic circuitry is configured to rotate the sensitivity direction of the angle sensor by providing the first biasing current $I_1$ as $I_1 = I * \sin δ * \cos θ$ and the second biasing current as $I_2 = I * (\sin δ - \cos δ) * \sin δ * \sin θ$ and changing the angle θ, the quantity I denoting a nominal current intensity and the quantity θ denoting an angle, and the electronic circuitry is further configured to determine the angle α to $α = θ - 90°$ or $α = θ + 90°$.

3. The angle sensor according to claim 2, wherein the angle δ is 90°.

4. A method of measuring an angle α which describes a direction of a magnetic field in a plane, the method comprising providing a first magnetic field sensor having a first sensitivity direction and delivering a first voltage $U_1$, providing a second magnetic field sensor having a second sensitivity direction and delivering a second voltage $U_2$, supplying a first biasing current $I_1$ to the first magnetic field sensor, supplying a second biasing current $I_2$ to the second magnetic field sensor, forming a signal U that is proportional to a sum of the first voltage $U_1$ and the second voltage $U_2$, adjusting the biasing currents $I_1$ and $I_2$ until the signal U equals 0, and determining the angle α based on the adjusted values of the biasing currents $I_1$ and $I_2$ when the signal U equals 0.

5. The method according to claim 4, wherein adjusting the biasing currents $I_1$ and $I_2$ until the signal U equals 0 occurs by providing the first biasing current $I_1$ as $I_1 = I * \sin δ * \cos θ$ and the second biasing current as $I_2 = I * (\sin δ - \cos δ) * \sin δ * \sin θ$, the quantity I denoting a nominal current intensity, the quantity θ denoting an angle and the quantity δ denoting an angle which the first sensitivity direction and the second sensitivity direction include, and changing the angle θ until the signal U equals 0, and the angle α is determined to $α = θ - 90°$ or $α = θ + 90°$.

6. The method according to claim 5, wherein the angle δ is 90°.

* * * * *